(12) United States Patent
McMackin et al.

(10) Patent No.: US 7,309,225 B2
(45) Date of Patent: Dec. 18, 2007

(54) MOAT SYSTEM FOR AN IMPRINT LITHOGRAPHY TEMPLATE

(75) Inventors: Ian M. McMackin, Austin, TX (US); Pankaj B. Lad, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 585 days.

(21) Appl. No.: 10/917,761

(22) Filed: Aug. 13, 2004

(65) Prior Publication Data

US 2006/0032437 A1 Feb. 16, 2006

(51) Int. Cl.
*B29C 59/16* (2006.01)
*B29C 35/08* (2006.01)

(52) U.S. Cl. ............... 425/215; 425/470; 425/810; 425/385; 264/1.36

(58) Field of Classification Search ......... 425/385, 425/810, 470, 174.4, 215, 403; 264/1.1
See application file for complete search history.

(56) References Cited

U.S. PATENT DOCUMENTS

| | | |
|---|---|---|
| 3,677,178 A | 7/1972 | Gipe |
| 4,201,800 A | 5/1980 | Alcorn et al. |
| 4,512,848 A | 4/1985 | Deckman et al. |
| 4,722,878 A | 2/1988 | Watakabe et al. |
| 4,731,155 A | 3/1988 | Napoli et al. |
| 4,959,252 A | 9/1990 | Bonnebat et al. |
| 5,028,366 A | 7/1991 | Harakal et al. |
| 5,206,983 A | 5/1993 | Guckel et al. |
| 5,259,926 A | 11/1993 | Kuwabara et al. |
| 5,348,616 A | 9/1994 | Hartman et al. |
| 5,425,848 A | 6/1995 | Haisma et al. |
| 5,477,058 A | 12/1995 | Sato |
| 5,512,131 A * | 4/1996 | Kumar et al. ............... 438/738 |
| 5,545,367 A | 8/1996 | Bae et al. |
| 5,601,641 A | 2/1997 | Stephens |
| 5,669,303 A | 9/1997 | Maracas et al. |
| 5,772,905 A | 6/1998 | Chou |

(Continued)

FOREIGN PATENT DOCUMENTS

EP 1460738 A2 9/2004

(Continued)

OTHER PUBLICATIONS

Yoneda et al., Translation of Japanese Patent 02-248480, Transparent Substrate with Water-Repellent and Antistaining Properties, and Structure Equipped Therewith Oct. 4, 1990.

(Continued)

*Primary Examiner*—James P. Mackey
*Assistant Examiner*—Dimple N. Bodawala
(74) *Attorney, Agent, or Firm*—Michael D. Carter; Fish & Richardson P.C.

(57) ABSTRACT

The present invention is directed to a body having a first area and a second area separated by a recess. The recess is dimensioned to reduce, if not prevent, a liquid moving along a surface of the body from traveling between the first and second areas. One or more alignment marks may be positioned within one of the first and second areas. In this manner, the recess functions as a moat by reducing, if not preventing, a quantity of the liquid from being in superimposition with the alignment marks.

22 Claims, 6 Drawing Sheets

U.S. PATENT DOCUMENTS

| | | | |
|---|---|---|---|
| 5,776,748 A | 7/1998 | Singhvi et al. |
| 5,817,376 A | 10/1998 | Everaerts et al. |
| 5,820,769 A | 10/1998 | Chou |
| 5,849,209 A | 12/1998 | Kindt-Larsen et al. |
| 5,849,222 A | 12/1998 | Jen et al. |
| 5,853,446 A | 12/1998 | Carre et al. |
| 5,937,758 A | 8/1999 | Maracas et al. |
| 5,948,470 A | 9/1999 | Harrison et al. |
| 5,952,127 A | 9/1999 | Yamanaka |
| 5,956,216 A | 9/1999 | Chou |
| 6,051,345 A | 4/2000 | Huang |
| 6,117,708 A | 9/2000 | Wensel |
| 6,165,911 A | 12/2000 | Calveley |
| 6,190,929 B1 | 2/2001 | Wang et al. |
| 6,218,316 B1 | 4/2001 | Marsh |
| 6,251,207 B1 | 6/2001 | Schultz et al. |
| 6,261,469 B1 | 7/2001 | Zakhidov et al. |
| 6,309,580 B1 | 10/2001 | Chou |
| 6,316,290 B1 | 11/2001 | Wensel |
| 6,334,960 B1 | 1/2002 | Willson et al. |
| 6,355,198 B1 | 3/2002 | Kim et al. |
| 6,387,787 B1 | 5/2002 | Mancini et al. |
| 6,391,217 B2 | 5/2002 | Schaffer et al. |
| 6,482,742 B1 | 11/2002 | Chou |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,646,662 B1 | 11/2003 | Nebashi et al. |
| 6,664,026 B2 | 12/2003 | Nguyen et al. |
| 6,696,220 B2 | 2/2004 | Bailey et al. |
| 6,713,238 B1 | 3/2004 | Chou et al. |
| 6,716,754 B2 | 4/2004 | Hofmann et al. |
| 6,743,368 B2 | 6/2004 | Lee |
| 6,753,131 B1 | 6/2004 | Rogers et al. |
| 6,776,094 B1 | 8/2004 | Whitesides et al. |
| 6,809,356 B2 | 10/2004 | Chou |
| 6,828,244 B2 | 12/2004 | Chou |
| 6,849,558 B2 | 2/2005 | Schaper |
| 6,890,688 B2 | 5/2005 | Mancini et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,932,934 B2 | 8/2005 | Choi et al. |
| 7,136,150 B2 * | 11/2006 | Sreenivasan et al. | 355/75 |
| 7,179,079 B2 * | 2/2007 | Sreenivasan et al. | 425/385 |
| 2002/0042027 A1 | 4/2002 | Chou et al. |
| 2002/0122993 A1 | 9/2002 | Katakura |
| 2002/0132482 A1 | 9/2002 | Chou |
| 2002/0135099 A1 | 9/2002 | Robinson et al. |
| 2002/0142229 A1* | 10/2002 | Resnick et al. | 430/5 |
| 2002/0159918 A1 | 10/2002 | Tseng et al. |
| 2002/0167117 A1 | 11/2002 | Chou |
| 2002/0175298 A1 | 11/2002 | Moniwa et al. |
| 2002/0177319 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0113638 A1 | 6/2003 | Mancini et al. |
| 2003/0180631 A1 | 9/2003 | Shiota et al. |
| 2003/0205657 A1 | 11/2003 | Voisin |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0026201 A1 | 2/2004 | Chou et al. |
| 2004/0046288 A1 | 3/2004 | Chou |
| 2004/0053146 A1 | 3/2004 | Sreenivasan et al. |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0150129 A1 | 8/2004 | Hougham et al. |
| 2004/0156108 A1 | 8/2004 | Chou et al. |
| 2004/0163563 A1 | 8/2004 | Sreenivasan et al. |
| 2004/0168586 A1 | 9/2004 | Bailey et al. |
| 2004/0192041 A1 | 9/2004 | Jeong et al. |
| 2004/0197843 A1 | 10/2004 | Chou et al. |
| 2004/0202865 A1 | 10/2004 | Homola et al. |
| 2004/0219246 A1 | 11/2004 | Jeans |
| 2004/0250945 A1 | 12/2004 | Zheng et al. |
| 2005/0037143 A1 | 2/2005 | Chou et al. |
| 2005/0051698 A1* | 3/2005 | Sreenivasan et al. | 249/135 |
| 2005/0064344 A1 | 3/2005 | Bailey et al. |
| 2005/0067379 A1 | 3/2005 | Sreenivasan et al. |
| 2005/0084804 A1 | 4/2005 | Truskett et al. |
| 2005/0098534 A1 | 5/2005 | Sreenivasan et al. |
| 2005/0100830 A1 | 5/2005 | Xu et al. |
| 2005/0158637 A1 | 7/2005 | Kim et al. |
| 2005/0184436 A1 | 8/2005 | Jeong et al. |
| 2005/0230882 A1* | 10/2005 | Watts et al. | 264/496 |
| 2006/0019183 A1 | 1/2006 | Volsin |

FOREIGN PATENT DOCUMENTS

| | | |
|---|---|---|
| JP | 61-40845 | 2/1986 |
| JP | 1-196749 | 8/1989 |
| JP | 02-24848 | 1/1990 |
| JP | 02-92603 | 4/1990 |
| JP | 02192045 | 7/1990 |
| JP | 2-248480 | 10/1990 |
| JP | 3-90345 | 4/1991 |
| JP | 9-278490 | 10/1997 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO 01/90816 | 11/2001 |
| WO | WO 02/07199 | 1/2002 |
| WO | WO 02/22916 | 3/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Yoneda et al., Translation of Japanese Patent 02-248480, Transparent Substrate Material with Water-Repllent and Anti-Staining Properties and Structure Equipped with Same Oct. 4, 1990.

U.S. Appl. No. 11/298,244, naming Inventors Watts et al., entitled Method of Forming a Compliant Template for UV Imprinting, filed Dec. 9, 2005.

Feynman, There's Plenty of Room at the Bottom, Dec. 1, 1959.

Xia et al., Soft Lithography, Angew. Chem. Int. Ed., pp. 550-575 Jan. 1, 1998.

Krug et al., Fine Patterning of Thin Sol-gel Films, Journal of Non-Crystalline Solids 147 & 148, pp. 447-450 Jan. 1, 1992.

Nguyen, Asymmetric Fluid-Structure Dynamics in Nanoscale Imprint Lithography, The University of Texas at Austin, pp. 1-111 Aug. 1, 2001.

Abstract of Japanese Patent 02-92603, Aug. 12, 2004.

Abstract of Japanese Patent 02-24848, Jan. 26, 1990.

Sowah, Diamond used to Break the Mould, Retrieved Sep. 2, 2003 from URL: http://www.electronictimes.com/story/OEG20020918S0003 Sep. 18, 2002.

U.S. Appl. No. 10/827,118, naming Inventors Watts et al., entitled A Method of Forming a Deep-Featured Template Employed in Imprint Lithography, filed Apr. 19, 2004.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.
Abstract of Japanese Patent 09-278490, Oct. 28, 1997.
Abstract of Japanese Patent 61-040845, Feb. 27, 1986.
Abstract of Japanese Patent 02-248480, Oct. 4, 1990.
Gehoski et al., Indium Tin Oxide Template Development for Step and Flash Imprint Lithgraphy, SPIE Microlithography Conference Feb. 1, 2005.
Dauksher et al., Repair of Step and Flash Imprint Lithography Templates, J. Vac. Sci. Technol. B 22(6), pp. 3306-3311 Nov. 1, 2004.
Nordquist et al., Image Placement Issues for ITO-based Step and Flash Imprint Lithography Templates, J. Vac. Sci. Technol. B, pp. 695-701 Mar. 1, 2004.
Dauksher et al., Step and Flash Imprint Lithography Template Characterization, from an Etch Perspective, J. Vac. Sci. Technol. B 21(6), pp. 2771-2776 Nov. 1, 2003.
Resnick et al., Imprint Lithography: Lab Curiosity or the Real NGL?, SPIE Microlithography Conference Feb. 1, 2003.
Mancini et al., Analysis of Critical Dimension Uniformity for Step and Flash Imprint Lithography, SPIE Microlithography Conference Feb. 1, 2003.
Mancini et al., Hydrogen Silsesquioxane for Direct Electron-Beam Patterning of Step and Flash Imprint Lithography Templates, J. Vac. Sci. Technol. B 20(6), pp. 2896-2901 Nov. 1, 2002.
Dauksher et al., Characterization of and Imprint Results Using Indium Tin Oxide-Based Step and Flash Imprint Lithography Templates, J. Vac. Sci. Technol. B 20(6), pp. 2857-2861 Nov. 1, 2002.
Nordquist et al.Q, Critical Dimension and Image Placement Issues for Step and Flash Imprint Lithography Templates, 22nd Annual BACUS Symposium on Photomask Technology, Monterey, CA Sep. 1, 2002.
Bailey et al., Template Fabrication Schemes for Step and Flash Imprint Lithography, Microelectronic Engineering, 61-62, pp. 461-467 Jan. 1, 2002.
Resnick et al., High Resolution Templates for Step and Flash Imprint Lithography, SPIE Microlithography Conference Feb. 1, 2002.
Resnick et al., New Methods for Fabricating Step and Flash Imprint Lithography Templates, NIST-SPIE Conference on Nanotechnology Sep. 1, 2001.
Shibuichi et al, Super Water- and Oil-Repellent Surfaces Resulting from Fractal Structure, Journal of Colloid and Interface Science, vol. 208, No. 1, pp. 287-294 Dec. 1, 1998.
Taniguchi et al., Diamond Nanoimprint Lithography, Nanotechnology, 2002, vol. 13, No. 5, pp. 592-596(5) Jan. 1, 2002.
Kiyohara et al., Abstract of Plasma Etching of CVD Diamond Films using an ECR-type Oxygen Source, http://www.iop.org/EJ/abstract/0957-4484/10/4/304 Sep. 26, 2003.
U.S. Appl. No. 11/126,946, naming Inventors Choi et al., entitled Formation of Discontinuous Films During an Imprint Lithography Process, filed May 11, 2005.
U.S. Appl. No. 11/127,041, naming Inventors Sreenivasan et al., entitled Step and Repeat Imprint Lithography Processes, filed May 11, 2005.
U.S. Appl. No. 11/127,060, naming Inventors Sreenivasan et al., entitled Step and Repeat Imprint Lithography Systems, filed May 11, 2005.
U.S. Appl. No. 11/136,897, naming Inventors Miller et al., entitled Imprint Lithography Template Having a Coating to Reflect and/or Absorb Actinic Energy, filed May 25, 2005.
Thompson et al., Fabrication of Step and Flash Imprint Lithography Templates Using Commercial Mask Processes, SPIE Microlithography Conference Feb. 1, 2003.
U.S. Appl. No. 10/687,519, filed Oct. 16, 2003, Nguyen et al.
U.S. Appl. No. 10/706,537, filed Nov. 12, 2003, Sreenivasan et al.
U.S. Appl. No. 10/833,240, filed Apr. 27, 2004, Watts et al.
U.S. Appl. No. 10/895,214, filed Jul. 20, 2004, Voison.
U.S. Appl. No. 11/051,941, filed Feb. 4, 2005, McMackin et al.
U.S. Appl. No. 11/051,533, filed Feb. 4, 2005, Fletcher et al.
Chou, Nanoimprint Lithography and Lithographically Induced Self-Assembly, MRS Bulletin, pp. 512-517, Jul. 1, 2001.
Choi et al., Design of Orientation Stages for Step and Flash Imprint Lithography, Precision Engineering, pp. 192-199, Jan. 1, 2001.
Colburn et al., Step and Flash Imprint Lithography for sub-100 nm Patterning, Proceedings of SPIE vol. 3997, pp. 453-457, Jan. 1, 2000.
Chou et al., Imprint Lithography with 25-Nanometer Resolution, Science vol. 272, pp. 85-87, Apr. 5, 1996.
Chou et al., Imprint Lithography with Sub-10 nm Feature Size and High Throughput, Microelectronic Engineering 35, pp. 237-240, Jan. 1, 1997.
Haisma et al., Mold-assisted Nanolithography: A Process for Reliable Pattern Replication, J. Vac. Sci. Technol. B, pp. 4124-4128, Nov. 1, 1996.
Chou et al., Imprint of Sub-25 nm Vias and Trenches in Polymers, Appl. Phys. Lett. 67 (21), Nov. 20, 1995.
Johnson et al., Advances in Step and Flash Imprint Lithography, SPIE Microlithography Conference, Feb. 23, 2003.
Chou et al., Lithographically Induced Self-assembly of Periodic Polymer Micropillar Arrays, J. Vac. Sci. Technol. B 17 (6), pp. 3197-3202, Nov. 1, 1999.
Colburn et al., Step and Flash Imprint Lithography: A New Approach to High-Resolution Patterning, Proc. Of SPIE, vol. 3676, Mar. 1, 1999.
Heidari, Nanoimprint Lithography at the 6 in. Wafer Scale, J. Vac. Sci. Technol. B 18(6), pp. 3557-3560, Nov. 1, 2000.
Translation of Japanese Patent 02-92603.
Translation of Japanese Patent 02-24848.
Chou et al., Ultrafast and Direct Imprint of Nanostructures in Silicon, Nature, col. 417, (Jun. 2002), pp. 835-837, Jun. 1, 2002.
Chou et al., Nanoimprint Lithography, Journal of Vacuum Science Technology B 14(16), pp. 4129-4133, Nov. 1, 1996.
Colburn et al., Development and Advantages of Step-and-Flash Lithography, Solid State Technology, Jul. 1, 2001.
Resnick et al., High Resolution Templates for Step and Flash Imprint Lithography, Journal of Microlithography, Microfabrication, and Microsystems, vol. 1, No. 3., Oct. 1, 2002.
Colburn et al., Characterization and Modeling of Volumetric and Mechanical Properties for Step and Flash Imprint Lithography Photopolymers, Journal of Vacuum Science Technology. vol. b. 19(6), Nov. 1, 2001.
Bailey et al., Step and Flash Imprint Lithography: Defect Analysis, Journal of Vacuum Science, B 19(6), pp. 2806-2810, Nov. 1, 2001.
Bailey et al., Step and Flash Imprint Lithography: Template Surface Treatment and Defect Analysis, Journal of Vacuum Science, B 18(6), pp. 3572-3577, Nov. 1, 2000.
Schneider et al., Stripes of partially Flourinated Alkyl Chains: Dipolar Langmuir Monolayers.
Translation of Japanese Patent 02-92603, Apr. 3, 1990.
Translation of Japanese Patent 02-24848, Jan. 26, 1990.
Schneider et al., Stripes of Partially Fluorinated Alkyl Chains: Dipolar Langmuir Monolayers, Mar. 2005.

* cited by examiner

MOAT SYSTEM FOR AN IMPRINT LITHOGRAPHY TEMPLATE

BACKGROUND OF THE INVENTION

The field of invention relates generally to imprint lithography. More particularly, the present invention is directed to producing templates having a moat system surrounding alignment marks.

Micro-fabrication involves the fabrication of very small structures, e.g., having features on the order of micro-meters or smaller. One area in which micro-fabrication has a sizable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is commonly referred to as imprint lithography and is described in detail in numerous publications, such as U.S. published patent applications 2004/0065976, entitled METHOD AND A MOLD TO ARRANGE FEATURES ON A SUBSTRATE TO REPLICATE FEATURES HAVING MINIMAL DIMENSIONAL VARIABILITY; 2004/0065252, entitled METHOD OF FORMING A LAYER ON A SUBSTRATE TO FACILITATE FABRICATION OF METEOROLOGY STANDARDS; 2004/0046271, entitled METHOD AND A MOLD TO ARRANGE FEATURES ON A SUBSTRATE TO REPLICATE FEATURES HAVING MINIMAL DIMENSIONAL VARIABILITY, all of which are assigned to the assignee of the present invention. The fundamental imprint lithography technique as shown in each of the aforementioned published patent applications includes formation of a relief pattern in a polymerizable layer and transferring a pattern corresponding to the relief pattern into an underlying substrate. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The substrate and the solidified layer are then subjected to processes to transfer, into the substrate, a relief image that corresponds to the pattern in the solidified layer.

One manner in which to locate the polymerizable liquid between the template and the substrate is by depositing a plurality of droplets of the liquid on the substrate. Thereafter, the polymerizable liquid is concurrently contacted by both the template and the substrate to spread the polymerizable liquid over the surface of the substrate. It is desirable to properly align the template with the substrate so that the proper orientation between the substrate and template may be obtained. To that end, both the template and substrate include alignment marks.

Thus, a need exists to provide alignment techniques for use in imprint lithographic processes.

SUMMARY OF THE INVENTION

The present invention is directed to a body having a first area and a second area separated by a recess. The recess is dimensioned to reduce, if not prevent, a liquid moving along a surface of the body from traveling between the first and second areas. One or more alignment marks may be positioned within one of the first and second areas. In this manner, the recess functions as a moat by reducing, if not preventing, a quantity of the liquid from being in superimposition with the alignment marks. These and other embodiments are discussed more fully below.

DETAILED DESCRIPTION OF THE INVENTION

Figure 1:
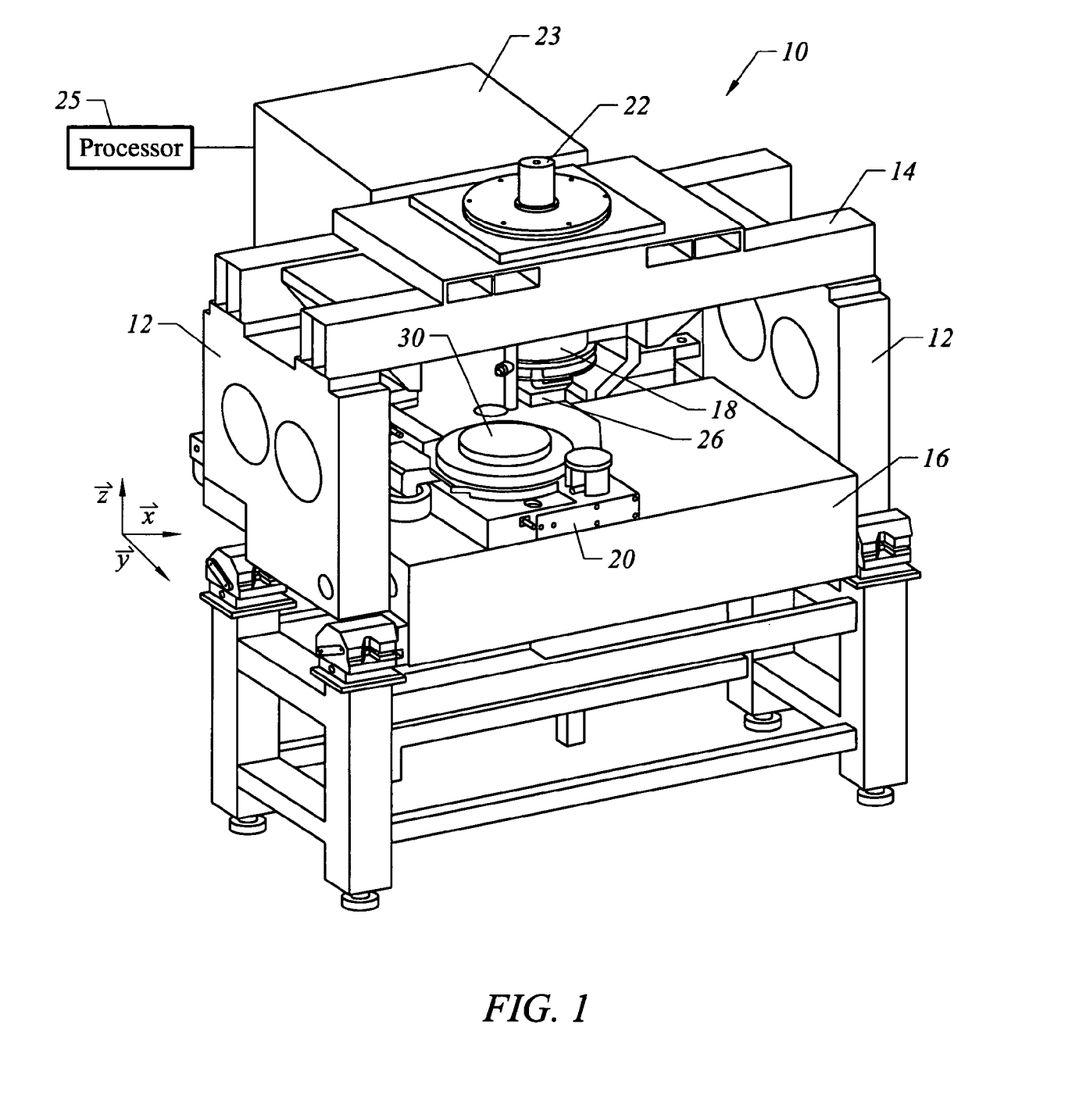
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16 and provides movement along the Z-axis. Disposed upon stage support 16 to face imprint head 18 is a motion stage 20. Motion stage 20 is configured to move with respect to stage support 16 along X- and Y-axes. It should be understood that imprint head 18 may provide movement along the X- and Y-axes, as well as the Z-axis, and motion stage 20 may provide movement in the Z-axis, as well as the X- and Y-axes. An exemplary motion stage device is disclosed in U.S. patent application Ser. No. 10/194,414, filed Jul. 11, 2002, entitled "Step and Repeat Imprint Lithography Systems," assigned to the assignee of the present invention, and which is incorporated by reference herein in its entirety. A radiation source 22 is coupled to lithographic system 10 to impinge actinic radiation upon motion stage 20. As shown, radiation source 22 is coupled to bridge 14 and includes a power generator 23 connected to radiation source 22. Operation of lithographic system 10 is typically controlled by a processor 25 that is in data communication therewith. An exemplary lithographic system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

Figure 2:
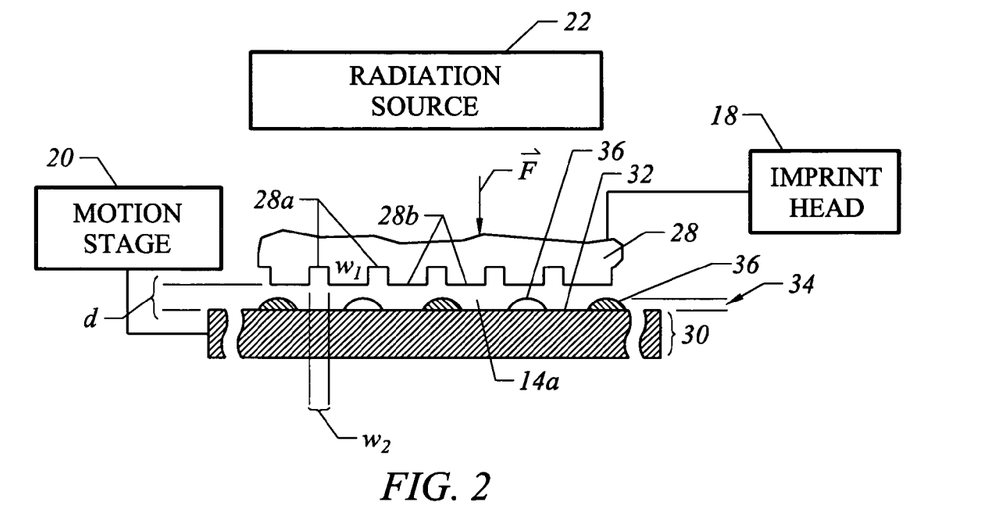
FIG. 2 is a simplified plan view of the lithographic system showing a mold included on a template shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a substrate 30 positioned on motion stage 20. To that end, imprint head 18 and/or motion stage 20 may vary a distance "d" between mold 28 and substrate 30. In this manner, the features on mold 28 may be imprinted into a flowable region of substrate 30, discussed more fully below. Radiation source 22 is located so that mold 28 is positioned between radiation source 22 and substrate 30. As a result, mold 28 is fabricated from a material that allows it to be substantially transparent to the radiation produced by radiation source 22.

Referring to FIG. 2, a flowable region, such as an imprinting layer 34, is disposed on a portion of a surface 32 that presents a substantially planar profile. A flowable region may be formed using any known technique, such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon, Nature*, Col. 417, pp. 835-837, June 2002. In the present embodiment, however, a flowable region consists of imprinting layer 34 being deposited as a plurality of spaced-apart discrete droplets 36 of a material on substrate 30, discussed more fully below. An exemplary system for depositing droplets 36 is disclosed in U.S. patent application Ser. No. 10/191,749, filed Jul. 9, 2002, entitled SYSTEM AND METHOD FOR DISPENSING LIQUIDS, and which is assigned to the assignee of the present invention, and which is incorporated by reference in its entirety herein. Imprinting layer 34 is formed from the material that may be polymerized and cross-linked to record the original pattern therein, defining a recorded pattern. An exemplary composition for the material is disclosed in U.S. patent application Ser. No. 10/463,396, filed Jun. 16, 2003 and entitled METHOD TO REDUCE ADHESION BETWEEN A CONFORMABLE REGION AND A PATTERN OF A MOLD, which is incorporated by reference in its entirety herein.

Figure 3:
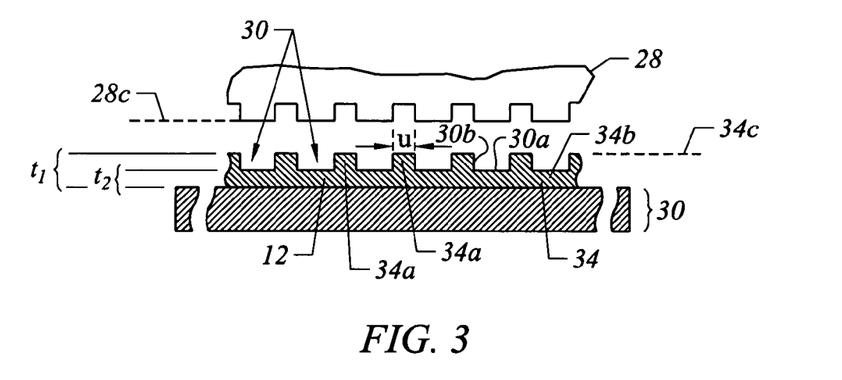
FIG. 3 is a simplified elevation view of a mold spaced-apart from the imprinting layer, shown in FIG. 2, after patterning of the imprinting layer.

Referring to FIGS. 2 and 3, the pattern recorded in imprinting layer 34 is produced, in part, by mechanical contact with mold 28. To that end, distance "d" is reduced to allow imprinting droplets 36 to come into mechanical contact with mold 28, spreading droplets 36 so as to form imprinting layer 34 with a contiguous formation of the material over surface 32. In one embodiment, distance "d" is reduced to allow sub-portions 34a of imprinting layer 34 to ingress into and fill recessions 28a.

To facilitate filling of recessions 28a, the material is provided with the requisite properties to completely fill recessions 28a, while covering surface 32 with a contiguous formation of the material. In the present embodiment, sub-portions 34b of imprinting layer 34 in superimposition with protrusions 28b remain after the desired, usually minimum, distance "d", has been reached, leaving sub-portions 34a with a thickness "$t_1$," and sub-portions 34b with a thickness "$t_2$." Thicknesses "$t_1$," and "$t_2$" may be any thickness desired, dependent upon the application.

Referring again to FIG. 2, after a desired distance "d" has been reached, radiation source 22 produces actinic radiation that polymerizes and cross-links the material, forming a cross-linked polymer material. As a result, the composition of imprinting layer 34 transforms from the material to the cross-linked polymer material, which is a solid. Specifically, the cross-linked polymer material is solidified to provide side 34c of imprinting layer 34 with a shape conforming to a shape of a surface 28c of mold 28, shown more clearly in FIG. 5. After imprinting layer 34 is transformed to consist of the cross-linked polymer material, the distance "d" is increased so that mold 28 and imprinting layer 34 are spaced-apart.

Referring to FIG. 3, additional processing may be employed to complete the patterning of substrate 30. For example, substrate 30 and imprinting layer 34 may be etched to transfer the pattern of imprinting layer 34 into substrate 30, providing a patterned surface 32a, shown in FIG. 6. To facilitate etching, the material from which imprinting layer 34 is formed from may be varied to define a relative etch rate with respect to substrate 30, as desired. The relative etch rate of imprinting layer 34 to substrate 30 may be in a range of about 1.5:1 to about 100:1.

Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form substrate 30 and imprinting layer 34. Exemplary etch processes may include plasma etching, reactive ion etching, chemical wet etching and the like. The sub portions 34b are typically referred to as the residual layer.

Additionally, it has been found beneficial to deposit a primer layer (not shown) when forming imprinting layer 34 upon substrate 32 which may or may not include any previously disposed patterned/unpatterned layer present on substrate 32. The primer layer (not shown) may function, inter alia, to provide a standard interface with imprinting layer 34, thereby reducing the need to customize each process to the material upon which imprinting layer 34 is to be deposited. In addition, the primer layer (not shown) may be formed from an organic material with the same etch characteristics as imprinting layer 34. The primer layer is fabricated in such a manner so as to possess a continuous, smooth, if not planar, relatively defect-free surface that may exhibit excellent adhesion to imprinting layer 34. The magnitude of a thickness of the primer layer (not shown) should be such that the same is able comprise the above-mentioned characteristics, but also allow the same to be substantially transparent such that underlying alignment marks, described further below, may be detected by have an optical sensor, mentioned further below. An exemplary material from which to form the primer layer (not shown) is available from Brewer Science, Inc. of Rolla Missouri under the trade name DUV30J-6. The primer layer (not shown) may be deposited using any know technique, include spin-on deposition and drop-dispense deposition.

Figure 4:
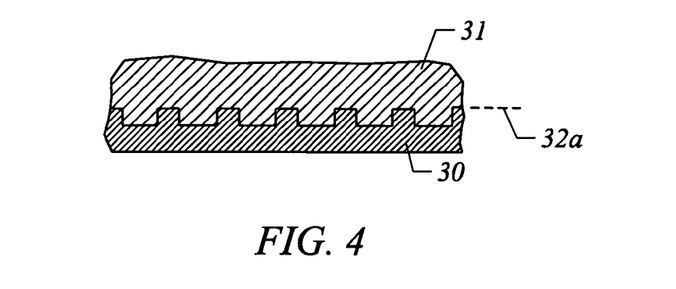
FIG. 4 is a simplified elevation view of an additional imprinting layer positioned atop of the substrate after etching of a pattern into the substrate that corresponds to the pattern in the first imprinting layer, shown in FIG. 3.

Referring to FIGS. 3 and 4, to form an additional imprinting layer, such as a layer 31 atop of surface 32a, or a primer layer (not shown) correct placement of mold 28 with respect to substrate 30 is important. To that end, overlay alignment schemes may include alignment error measurement and/or alignment error compensation and/or placement error measurement and correction. Placement error, as used herein, generally refers to X-Y positioning errors between a template and a substrate (that is, translation along the X- and/or Y-axis). Placement errors, in one embodiment, are determined and corrected for by using an optical imaging system 40, shown in FIG. 5, to sense alignment marks discussed below with respect to FIG. 6.

Figure 5:
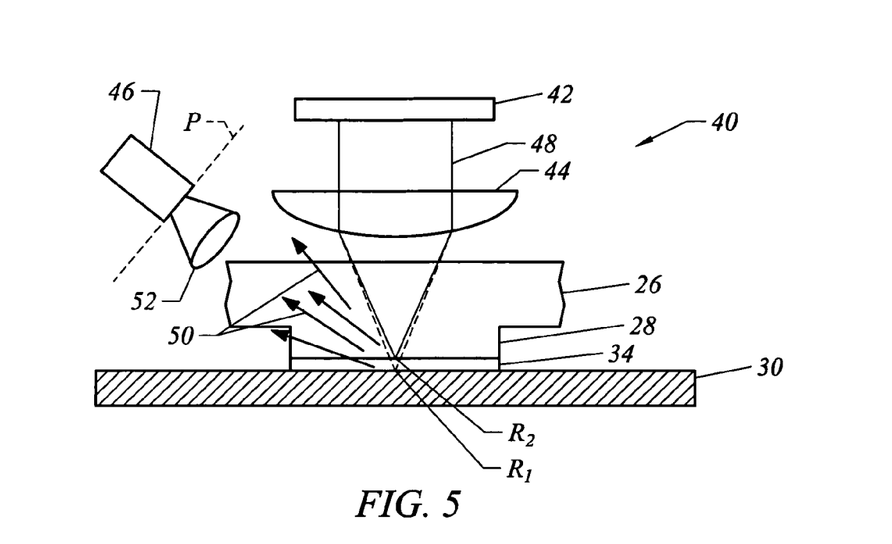
FIG. 5 is a plan view of an imaging system employed to sense alignment marks included on the template of FIG. 1.

Referring to FIG. 5, optical imaging system 40 includes a light source 42 and an optical train 44 to focus light upon substrate 30. Optical imaging system 40 is configured to focus alignment marks lying in differing focal planes onto a single focal plane, P, wherein an optical sensor 46 may be positioned. As a result, optical train 44 is configured to provide wavelength-dependent focal lengths. Differing wavelengths of light may be produced in any manner known in the art. For example, light source 42 may comprise a single broadband source of light that may produce wavelengths, shown as light 48, which impinges impinge upon optical train 44. Optical band-pass filters (not shown) may be disposed between the broadband source and the alignment marks (not shown). Alternatively, a plurality of sources of light (not shown) may be employed, each one of which produces distinct wavelengths of light. Light 48 is focused by optical train 44 to impinge upon alignment marks (not shown) at one or more regions, shown as region $R_1$ and region $R_2$. Light reflects from regions $R_1$ and $R_2$, shown as a reflected light 50, and is collected by a collector lens 52. Collector lens 52 focuses all wavelengths of reflected light 50 onto plane P so that optical sensor 46 detects reflected light 50.

Figure 6:
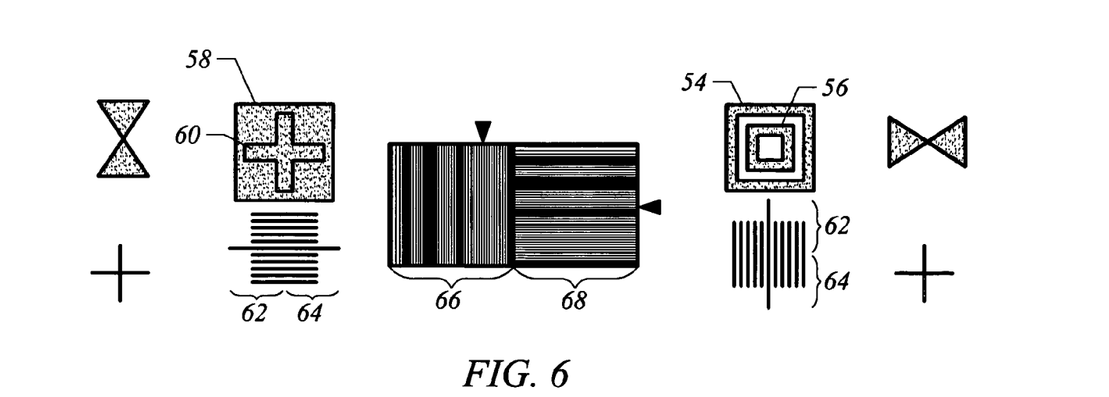
FIG. 6 is a plan view of exemplary alignment marks utilized in the present invention.

Referring to FIGS. 1 and 6, alignment marks may be of many configurations and are arranged in pairs with one of the alignment marks of the pair being disposed on template 26. The remaining alignment mark being positioned on substrate 30, e.g., in a previously deposited imprinting layer or etched into substrate 30 or a previously deposited layer disposed thereon. For example, alignment marks may include first and second polygonal marks 54 and 56, depicted as squares, but may be any polygonal shape desired. Another configuration for alignment marks are shown as crosses, shown as 58 and 60. Also additional alignment marks may be employed, such as vernier marks 62 and 64, as well as Moiré gratings, shown as 66 and 68.

Figure 7:
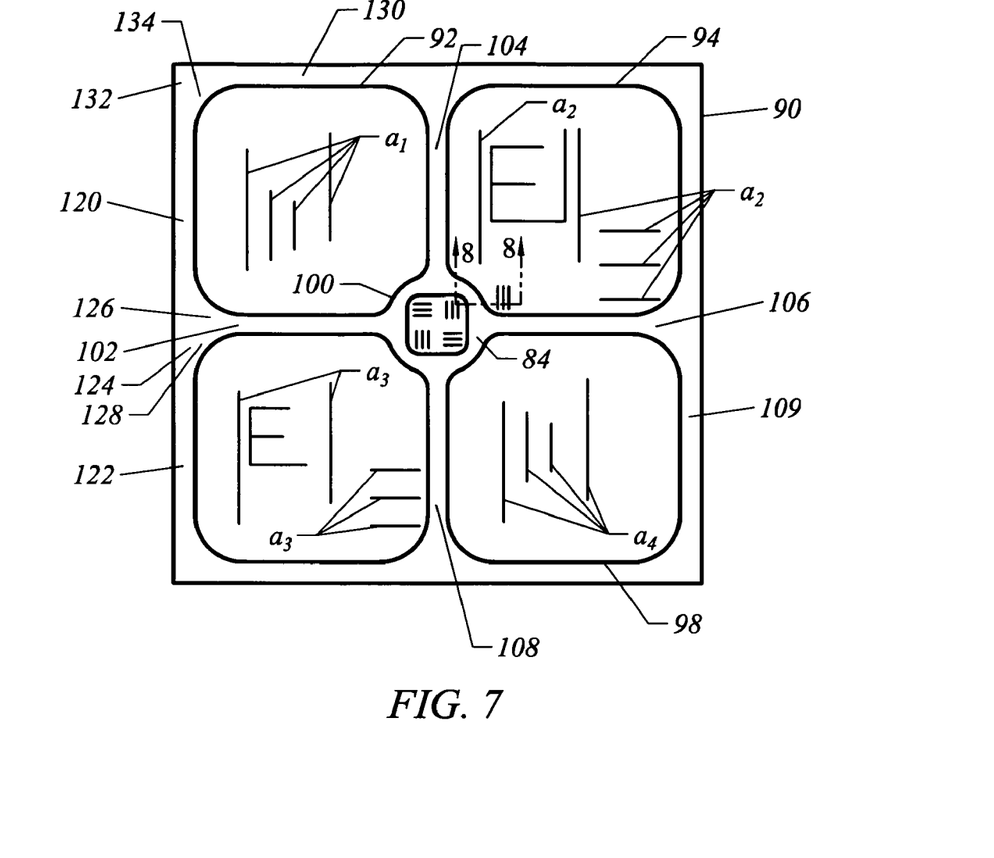
FIG. 7 is a bottom-up view of the template shown in FIG. 1, in accordance with a first embodiment of the present invention.
Figure 8:
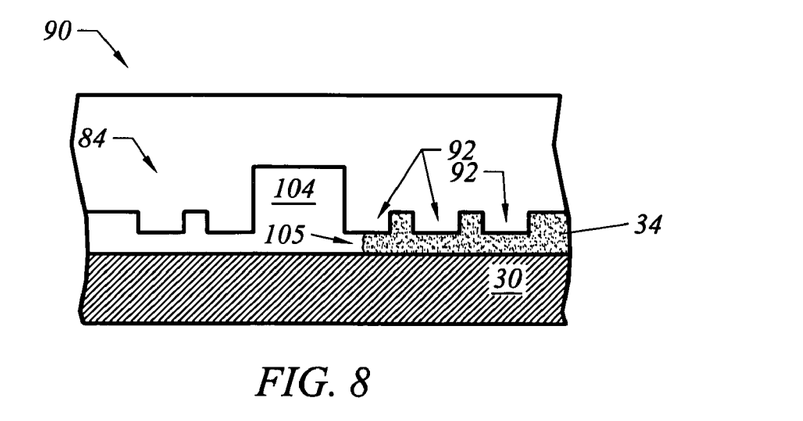
FIG. 8 is a cross-sectional view of the template shown in FIG. 7 taken along lines 8-8.

Referring to FIGS. 2, 7, and 8, wavelengths are selected to obtain a desired focal length, depending upon the gap between mold 28 and substrate 30 or an imprinting layer disposed on substrate 30. Under each wavelength of light used, each alignment mark may produce two images on the imaging plane. First polygonal alignment mark 54, using a specific wavelength of light, presents as a focused image on sensor 46. Second polygonal alignment mark 56, using the same wavelength of light, presents as an out-of-focus image on sensor 46. In order to eliminate each out-of-focus image, several methods may be used.

Another concern with overlay alignment for imprint lithography processes that employ UV curable liquid materials may be the visibility of the alignment marks. For the overlay placement error measurement, two overlay marks, such as the marks discussed above with respect to FIG. 8, are employed, referred to collectively as alignment marks 84. However, since it is desirable for template 26 to be transparent to a curing agent, the template overlay marks, in some embodiments, are not opaque lines. Rather, the template overlay marks are topographical features of the template surface. In some embodiments, the overlay marks are made of the same material as the template. In addition, UV curable liquids may have a refractive index that is similar to the refractive index of the template materials, e.g., quartz or fused silica. Therefore, when the UV curable liquid fills the gap between template 26 and substrate 30, template overlay marks may become very difficult to recognize. If the template overlay marks are made with an opaque material, e.g., chromium or nickel, the UV curable liquid below the overlay marks may not be properly exposed to the UV light, e.g., having wavelengths in a range of 310 to 365 nm. This frustrates patterning an underlying surface to include alignment mark for subsequent processing, were it desired to form alignment marks in substrate 30 by imprinting the pattern corresponding to the alignment marks into imprinting layer 34 with mold 28 and subsequently etching the alignment marks into substrate. Therefore, several reasons exist to prevent imprinting material from being in superimposition with alignment marks.

Referring to FIG. 7, the present invention reduces, if not prevents, material in imprinting layer 34 from entering a region of substrate 30 in superimposition with alignment marks 84. To that end, alignment marks 84 are surrounded by a moat system 100. Segments 102, 104, 106, and 108 of moat system 100 separate molds 92, 94, 96, and 98. Specifically, segments 102, 104, 106, and 108 have a depth associated therewith, e.g., 30 microns, to minimize the egression of the material in imprinting layer 34 therein from adjacent active molds 92, 94, 96, and 98 due to capillary forces. Additionally, moat system 100 may include a segment 109 that surrounds molds 92, 94, 96, and 98. As mentioned previously, when the desired gap defined between molds 92, 94, 96 and 98 and substrate 30, or a layer previously deposited on substrate 30 occurs, the material in imprinting layer 34 forms a contiguous region of material therebetween. As a result of capillary attraction of the material of imprinting layer 34 to both mold 28 and substrate 30, the material of imprinting layer 34 does not typically extend to regions of substrate 30 in superimposition with moat system 100. Rather, the material of imprinting layer typically remains confined within a region of substrate 30 that is in superimposition with one of the molds 92, 94, 96 and 98.

Referring to FIG. 8, the material of imprinting layer 34 forms a meniscus 105 at the periphery of mold 94 due to the surface tension of the material in imprinting layer 34 and the same is substantially absent from segment 104. The surface tension associated with the material in meniscus 105 substantially reduces the probability that the material extends through into segment 104. It was determined, however, that the probability that the material of imprinting layer 34 ingressing into moat system 100, such as segment 104 would be substantially minimized by minimizing surface discontinuities in the surfaces defining moat system 100. Specifically, it was determined that surface discontinuities, such as sharp edges, right angles and the like, might cause the material of imprinting layer 34 to ingress into moat system 100 and be located in regions of substrate 30 in superimposition with alignment marks 84, shown in FIG. 7, which is undesirable.

Figure 9:
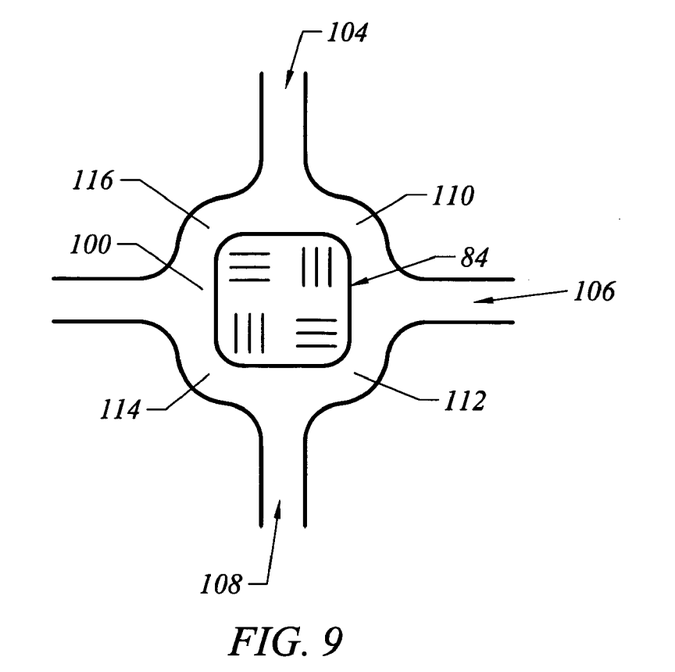
FIG. 9 is a bottom-up view of the template shown in FIG. 7, in accordance with a second embodiment of the present invention.

Referring to FIGS. 7, 8 and 9, therefore, to minimize, if not prevent, material of the imprinting layer 34 from being disposed upon a region of substrate 30 in superimposition with alignment marks 84, moat system 100 abrogates most, if not all sharp corners by including portions 110, 112, 114, and 116 defined by arcuate boundaries. Portions 110, 112, 114, and 116 surround alignment marks 84. Specifically, portion 110 is disposed between segments 104 and 106;

portion 112 is disposed between segments 106 and 108; portion 114 is disposed between segments 102 and 108; and portion 116 is disposed between segments 102 and 104.

The arcuate junctions/boundaries of portions 110, 112, 114, and 116 minimize surface discontinuities in the surfaces the define moat system 100, thereby minimizing imprinting material, such as imprinting material in meniscus 105, from crossing moat system 100 when meniscus coming into contact therewith. This, it is believed, reduces the probability of, if not prevent, the material in imprinting layer 34 from becoming disposed upon a region of substrate 30 in superimposition with alignment marks 84.

In a further embodiment, moat system 100 comprises a plurality of non-linear segments surrounding molds 92, 94, 96, and 98 to further minimize, if not prevent, the material in imprinting layer 34 becoming disposed upon a region of substrate 30, shown in FIG. 8, in superimposition with alignment marks 84. Specifically, connecting any two linear segments of moat system 100 is a non-linear segment, i.e., an arcuate segment. An example of a non-linear segment connecting two linear segments of moat system 100 is shown in FIG. 7. More specifically, disposed between a linear segment 120 and a linear segment 122 is a non-linear segment 124, wherein non-linear segment 124 comprises arcuate portions 126 and 128, i.e., portions with a smooth contour lacking corners. In another example, disposed between linear segment 120 and a linear segment 130 is a non-linear segment 132, wherein non-linear segment 132 comprises an arcuate portion 134, i.e. a portion with a smooth contour lacking corners. Non-linear segments 124 and 132 may be described analogously to the arcuate boundaries of portions 120, 112, 114, and 116, as mentioned above, and thus, non-linear segments 124 and 132 reduce the probability of, if not prevent, the material in imprinting layer 34 from becoming disposed upon a region of substrate 30 in superimposition with alignment marks 84.

Figure 10:
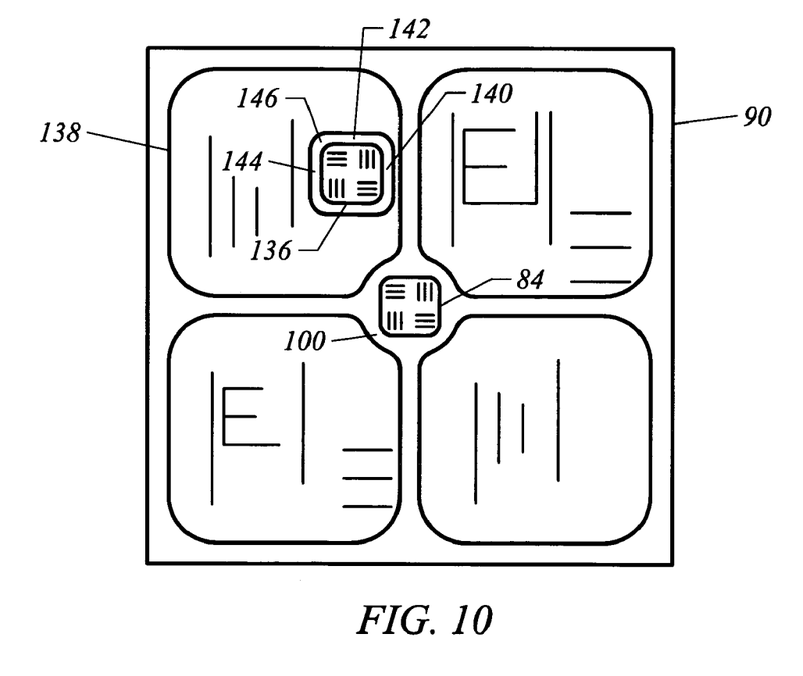
FIG. 10 is a bottom-up view of the template shown in FIG. 7, in accordance with a second embodiment of the present invention.

Referring to FIG. 10, in another embodiment, an additional set of alignment marks 136 may be placed within a mold, shown as a mold 138, of template 90. However, the region of mold 138 in which alignment marks 136 are positioned does not include any patterned features. Alignment marks 136 are surrounded by a moat system 140 so as to prevent the material in imprinting layer 34 from coming into contact therewith for the reasons discussed above with respect to FIGS. 7 and 8. Moat system 140 comprises a plurality of linear segments, with two linear segments of the plurality being connected by a non-linear segment. An example of a non-linear segment connecting two linear segments of moat system 140 is shown as a linear segment 142 and a linear segment 144 having a non-linear segment 146 disposed therebetween. Non-linear segment 146 is analogous to non-linear segments 124 and 132, mentioned above, and thus non-linear segment 146 reduces the probability, if not prevent, the imprinting material from becoming disposed upon a region of substrate 30, shown in FIG. 8, in superimposition with alignment marks 136. Alignment marks 136 may be in addition to alignment marks 84, wherein alignment marks 84 are surrounded by moat system 100.

Figure 11:
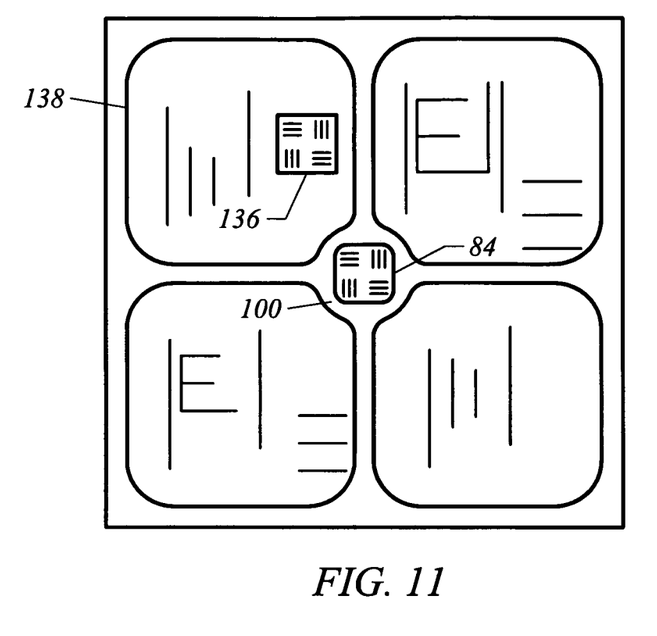
FIG. 11 is a bottom-up view of the template shown in FIG. 7, in accordance with a third embodiment of the present invention.

Alternatively, referring to FIG. 11, alignment marks 136 may not be surrounded by a moat system, with alignment marks 136 being disposed within mold 138. However, alignment marks 84 may be surrounded by moat system 100. It has been found desirable to have at least one of alignment marks 84 and 136 not surrounded by a moat system and not formed from opaque material.

Figure 12:
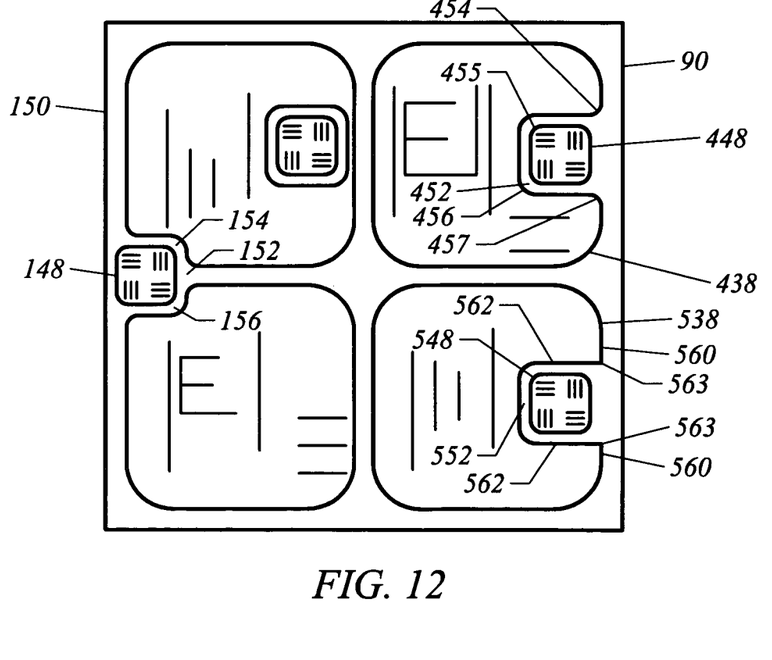
FIG. 12 is a plan view of a template having alignment marks and a moat system disposed along an edge of the template in accordance with a fourth embodiment.

In a further embodiment, referring to FIG. 12, alignment marks 148 may be disposed along an edge 150 of template 90 located between molds 238 and 239. A moat system 152, analogous to moat system 100 described above, surrounds alignment marks 148 and comprises arcuate portions 154 and 156, which are analogous to arcuate portions 110, 112, 114, and 116, and thus arcuate portions 154 and 156 reduce the probability of, if not prevent, the imprinting material from becoming disposed upon a region of substrate 30, shown in FIG. 13, in superimposition with alignment marks 148.

Alignment marks may be located at an edge of molds 438 and 538, shown as alignment marks 448 and 548, respectively. A moat system 452, analogous to moat system 100 described above, surrounds alignment mark 448 and comprises arcuate portions 454, 455, 456 and 457, which are analogous in function to the arcuate boundaries of portions 110, 112, 114, and 116. Specifically, each of arcuate portions 454, 455, 456 and 457 reduce the probability of, if not prevent, the material in imprinting layer 34 from becoming disposed upon a region of substrate 30, shown in FIG. 13, in superimposition with alignment marks 448.

It should be understood that it is not necessary for an arcuate segment to couple transversely extending linear segments. For example, moat system 552 includes a first linear segments 560 and a second linear segments 562 coupled together via a corner segment, which in this case is shown as a right angle 563, but may be formed from an acute angle or an obtuse angle. It was found that the presence of corner segments positioned at the boundary of mold 538 did not greatly undermine the problem solved by the present invention, i.e., deminimus amounts of the material in imprinting layer 34 extend into moat system 552.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A template comprising:
    a body having a first area and a second area, said second area laying outside of said first area; and
    a moat, disposed between said first and second areas, having geometric properties associated therewith including two transversely extending linear segments and an arcuate junction extending therebetween, with said geometric properties being established to minimize ingression into said moat by a liquid.

2. The template as recited in claim 1 wherein said geometric properties include providing said moat a surface having an arcuate junction coupled between two transversely extending linear segments, to minimize shape discontinuities in said surface.

3. The template as recited in claim 1 wherein said properties include providing said moat with a first portion configured to minimize shape discontinuities of said moat and a second portion in which shape discontinuities of said moat are present.

4. The template as recited in claim 1 wherein template includes a mold having a boundary wherein said properties include providing said moat with a first portion configured to minimize shape discontinuities of said moat and a second portion in which shape discontinuities of said moat are present located proximate to said boundary.

5. The template as recited in claim 1 wherein said geometric properties are further established to minimize a quantity of said liquid from being in superimposition with said second area.

6. The template as recited in claim 1 further including alignment marks, with said alignment marks being disposed in said second area.

7. The template as recited in claim 1 further including alignment marks disposed in said second area, wherein said alignment marks are a plurality of protrusions on a surface of said template.

8. The template as recited in claim 1 wherein said moat surrounds said second area.

9. The template as recited in claim 1 wherein said body further includes an additional moat disposed within said first area.

10. A template comprising:
a body having a first area and a second area, said second area laying outside of said first area; and
a moat, disposed between said first and second areas, having a pair of transversely extending linear segments, with an arcuate segment connected therebetween.

11. The template as recited in claim 10 wherein said arcuate segment is further established to prevent said liquid from being in superimposition with said second area.

12. The template as recited in claim 10 wherein said properties include providing said moat with a first portion configured to minimize shape discontinuities of said moat and a second portion in which shape discontinuities of said moat are present.

13. The template as recited in claim 10 wherein template includes a mold having a boundary wherein said properties include providing said moat with a first portion configured to minimize shape discontinuities of said moat and a second portion in which shape discontinuities of said moat are present located proximate to said boundary.

14. The template as recited in claim 10 further including alignment marks, with said alignment marks being disposed in said second area.

15. The template as recited in claim 10 further including alignment marks disposed in said second area, wherein said alignment marks are formed from a first material, wherein said template is formed for a second material being substantially the same as said first material.

16. The template as recited in claim 10 wherein said body further includes an additional moat disposed within said first area surrounding additional alignment marks.

17. A template having alignment marks formed thereon, said template comprising:
a body having a first area, with said alignment marks being disposed in a second area laying outside of said first area; and
a moat, defined by a surface surrounding said template alignment marks, said surface having geometric properties associated therewith including two transversely extending linear segments and an arcuate junction extending therebetween to minimize discontinuities in a shape of said surface.

18. The template as recited in claim 17 wherein said geometric properties are further established to prevent said liquid from being in superimposition with said second area.

19. The template as recited in claim 17 wherein said body further includes an additional moat disposed within said first area surrounding additional alignment marks.

20. A template comprising:
a body having a first area and a second area, said second area laying outside of said first area; and
a moat, disposed between said first and second areas, having geometric properties associated therewith including a surface having an arcuate junction coupled between two transversely extending linear segments to minimize shape discontinuities in said surface, with said geometric properties being established to minimize ingression into said moat by a liquid.

21. A template comprising:
a body having a first area and a second area, said second area laying outside of said first area; and
a moat, disposed between said first and second areas, having geometric properties associated therewith, with said geometric properties being established to minimize ingression into said moat by a liquid, said moat having a first portion configured to minimize shape discontinuities of said moat and a second portion in which shape discontinuities of said moat are present.

22. A template comprising:
a body having a first area and a second area, said second area laying outside of said first area; and
a moat, disposed between said first and second areas, having geometric properties associated therewith, with said geometric properties being established to minimize ingression into said moat by a liquid, said moat having a boundary wherein said properties include providing said moat with a first portion configured to minimize shape discontinuities of said moat and a second portion in which shape discontinuities of said moat are present located proximate to said boundary.

* * * * *